(12) United States Patent
Chou et al.

(10) Patent No.: US 6,953,723 B2
(45) Date of Patent: Oct. 11, 2005

(54) METHOD FOR FORMING BOTTLE SHAPED TRENCH

(75) Inventors: Shih-Chung Chou, Kaohsiung (TW); Yi-Nan Chen, Taipei (TW)

(73) Assignee: NANYA Technology Corporation, Taoyuan (TW)

( * ) Notice: Subject to any disclaimer, the term of this patent is extended or adjusted under 35 U.S.C. 154(b) by 0 days.

(21) Appl. No.: 10/768,069

(22) Filed: Feb. 2, 2004

(65) Prior Publication Data

US 2005/0170581 A1 Aug. 4, 2005

(51) Int. Cl.[7] .......................................... H01L 21/8242
(52) U.S. Cl. ...................... 438/243; 438/386; 438/474
(58) Field of Search ................................. 438/243, 242, 438/386, 474, 514, 528, 663, 700, 770, 775

(56) References Cited

U.S. PATENT DOCUMENTS

| | | | |
|---|---|---|---|
| 5,837,612 A * | 11/1998 | Ajuria et al. ............... | 438/697 |
| 6,018,174 A * | 1/2000 | Schrems et al. ............ | 257/296 |
| 6,071,823 A * | 6/2000 | Hung et al. ................. | 438/714 |
| 6,194,755 B1 * | 2/2001 | Gambino et al. ........... | 257/301 |
| 6,232,171 B1 * | 5/2001 | Mei ........................... | 438/246 |
| 6,426,254 B2 * | 7/2002 | Kudelka et al. ............ | 438/246 |
| 6,716,757 B2 * | 4/2004 | Lin et al. .................... | 438/705 |

* cited by examiner

*Primary Examiner*—David Nhu
(74) *Attorney, Agent, or Firm*—Bacon & Thomas, PLLC (57) ABSTRACT

Disclosed is a method for forming a bottle shaped trench. The method of the present invention includes steps of providing a substrate; forming a plurality of operation layers on the substrate; forming a photoresist layer on the operation layers to define a predetermined position; forming a trench according to the predetermined position; implanting predetermined ions, which reduces oxidizing rate of the sidewall of the trench, into the upper sidewall of the trench; oxidizing the sidewall of the trench to form an oxide layer, in which the portion of the oxide layer formed at the portion of the sidewall implanted with the ions is thin, while the portion of the oxide layer formed at the portion of the sidewall not implanted with the ions is thick; and removing the oxide layer to form a bottle shaped trench.

3 Claims, 8 Drawing Sheets

METHOD FOR FORMING BOTTLE SHAPED TRENCH

BACKGROUND OF THE INVENTION

1. Field of the Invention

The present invention relates to a process for a trench capacitor in a semiconductor device, more specifically, to a method for forming a bottle shaped deep trench for a deep trench capacitor.

2. Description of the Prior Art

As the semiconductor memory such as DRAM is getting more and more compact, to avoid occupying large area but maintain high capacitance, the techniques for trench capacitors are widely developed.

In order to increase capacitance, one of the methods is to increase the critical dimension of a deep trench for forming the trench capacitor in the semiconductor device. However, if the opening of the deep trench is too large, the area of the active area is occupied. Accordingly, a technique for a "bottle shaped" trench structure is developed.

The present invention provides a novel method for forming a bottle shaped deep trench for making a trench capacitor. By the method in accordance with the present invention, the bottle shaped deep trench can be formed through simple processing steps.

SUMMARY OF THE INVENTION

An objective of the present invention is to provide a method for forming a bottle shaped trench, which can form a bottle shaped trench by simple processing steps.

In accordance with an aspect of the present invention, the method for forming a bottle shaped trench comprises steps of providing a substrate; forming a plurality of operation layers on the substrate; forming a photoresist layer on the operation layers to define a predetermined position; forming a trench at the position; implanting predetermined material particles into the upper portion of the sidewall of the trench, the material particles lowering oxidability of the sidewall of the trench; oxidizing the sidewall of the trench to form an oxide layer, the portion of the oxide layer formed at the portion of the sidewall implanted with the material particles being thinner than the portion of the oxide layer formed at the portion of the sidewall not implanted with the material particles; and removing the oxide layer to form a bottle shaped trench.

In accordance with another aspect of the present invention, in the method for forming a bottle shaped trench, the material particles are implanted by tilt implantation.

In accordance with a further aspect of the present invention, in the method for forming a bottle shaped trench, the material particles are nitrogen ions.

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

DETIALED DESCRIPTION OF THE PREFERRED EMBODIMENT

An embodiment of the present invention will be described in detail with reference to the accompanying drawings.

Figure 1A:
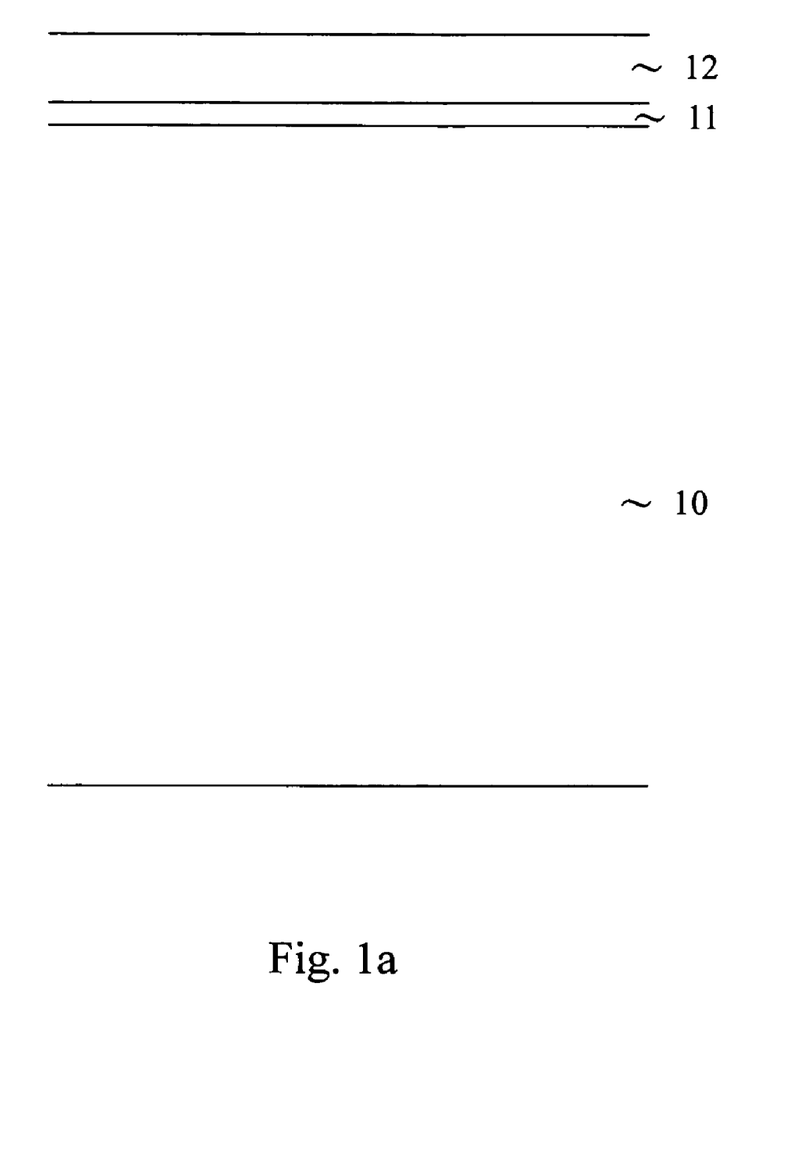
FIGS. 1a to 1h illustrate the respective steps of a method for forming a bottle shaped trench of an embodiment in accordance with the present invention.
Figure 1B:
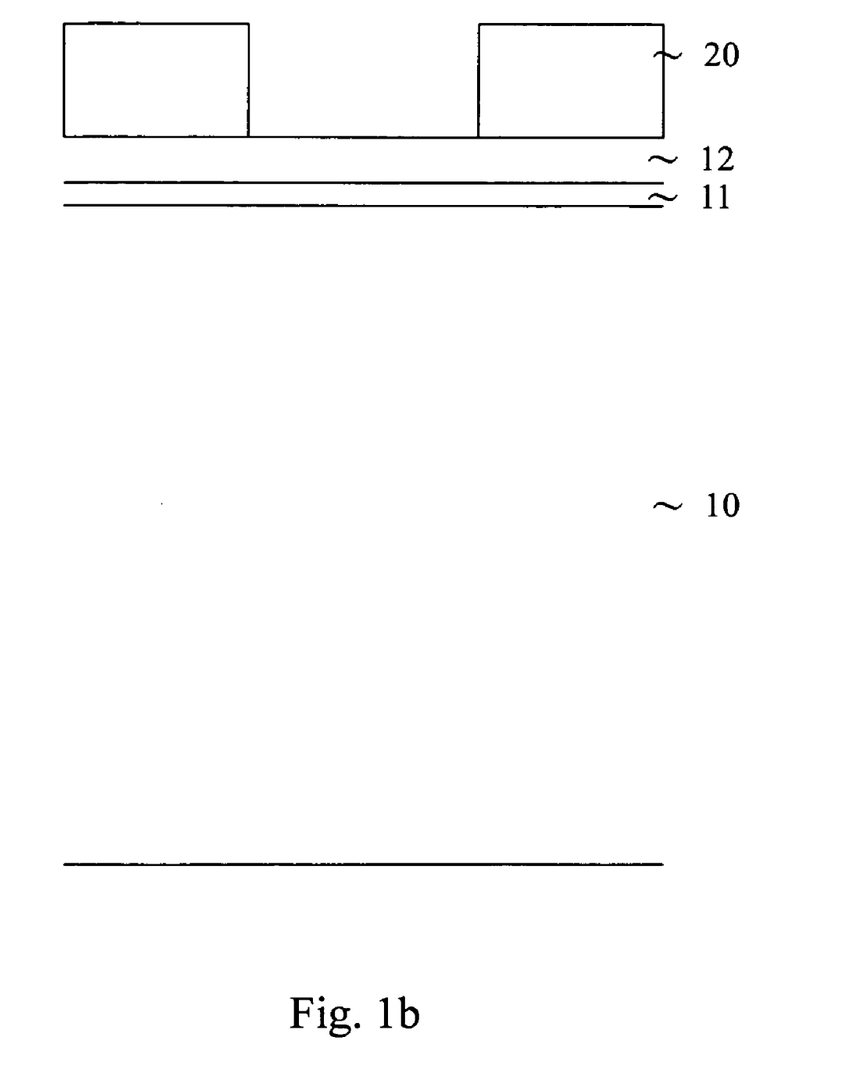

As shown in FIG. 1a, operation layers such as a pad oxide layer 11 and a pad nitride layer 12 are deposited on a substrate 10. Then a photoresist layer 20 is formed to define a position where a deep trench is to be formed, as shown in FIG. 1b.

Figure 1C:
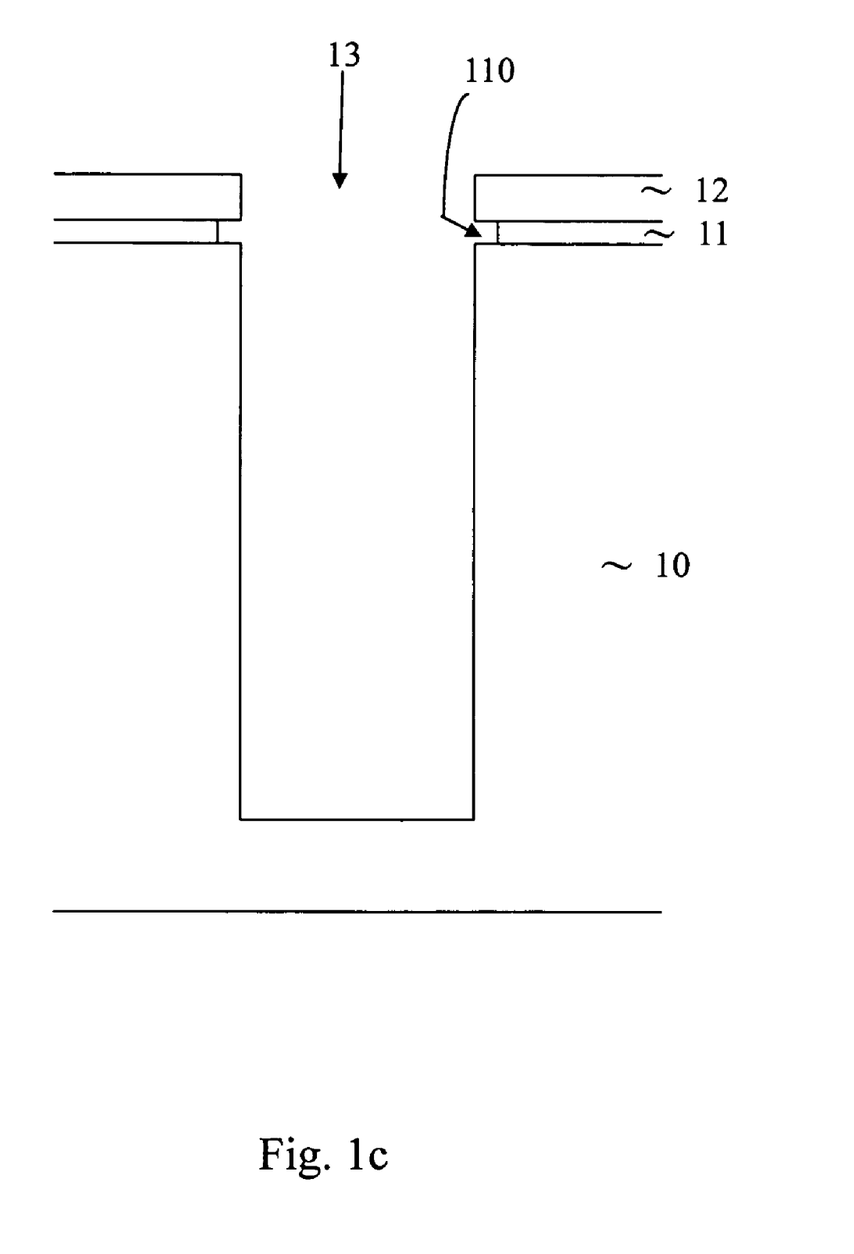

Next, a deep trench 13 is dug by a proper etching method, as shown in FIG. 1c. In the practical etching process for forming the trench, an undercut phenomenon is often present in the pad oxide layer 11, and therefore a groove 110 is formed, as shown in the drawing.

Figure 1D:
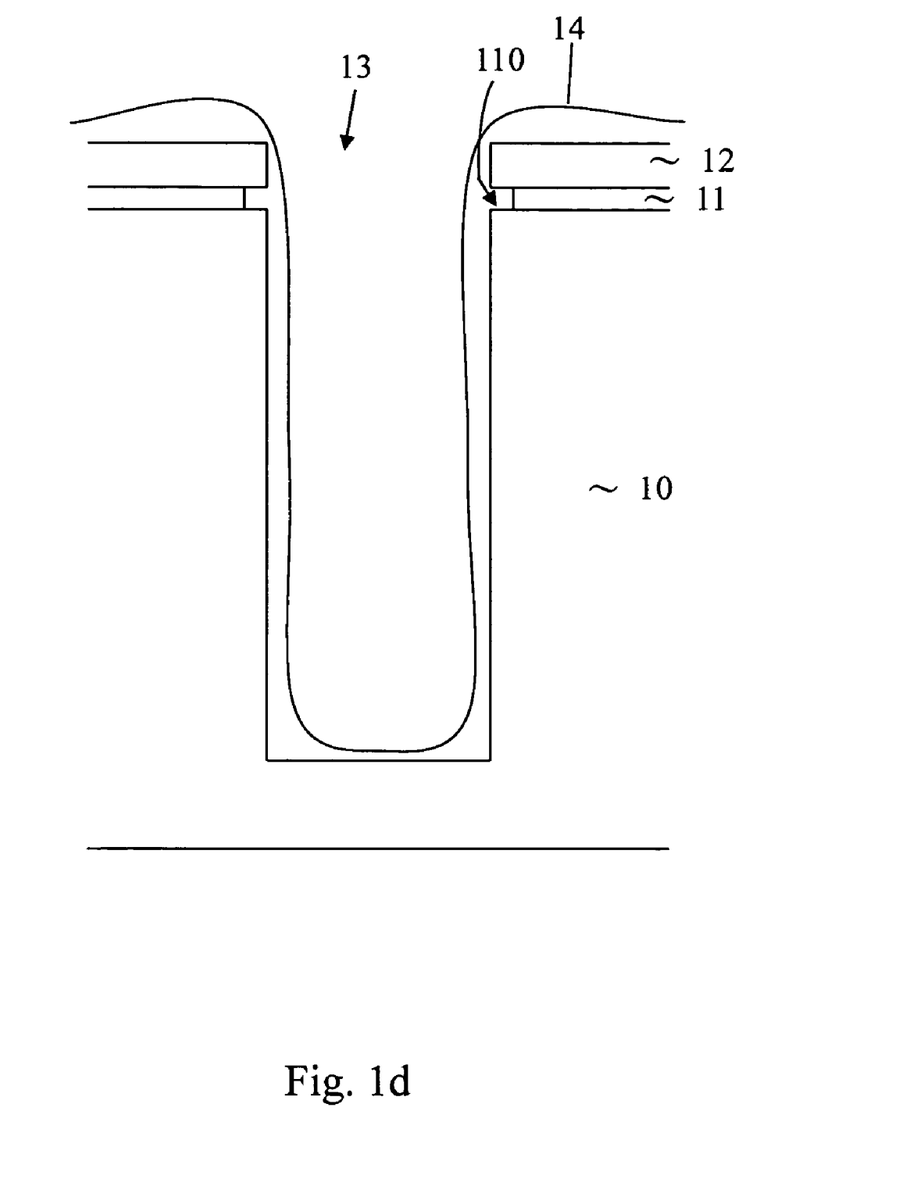
Figure 1E:
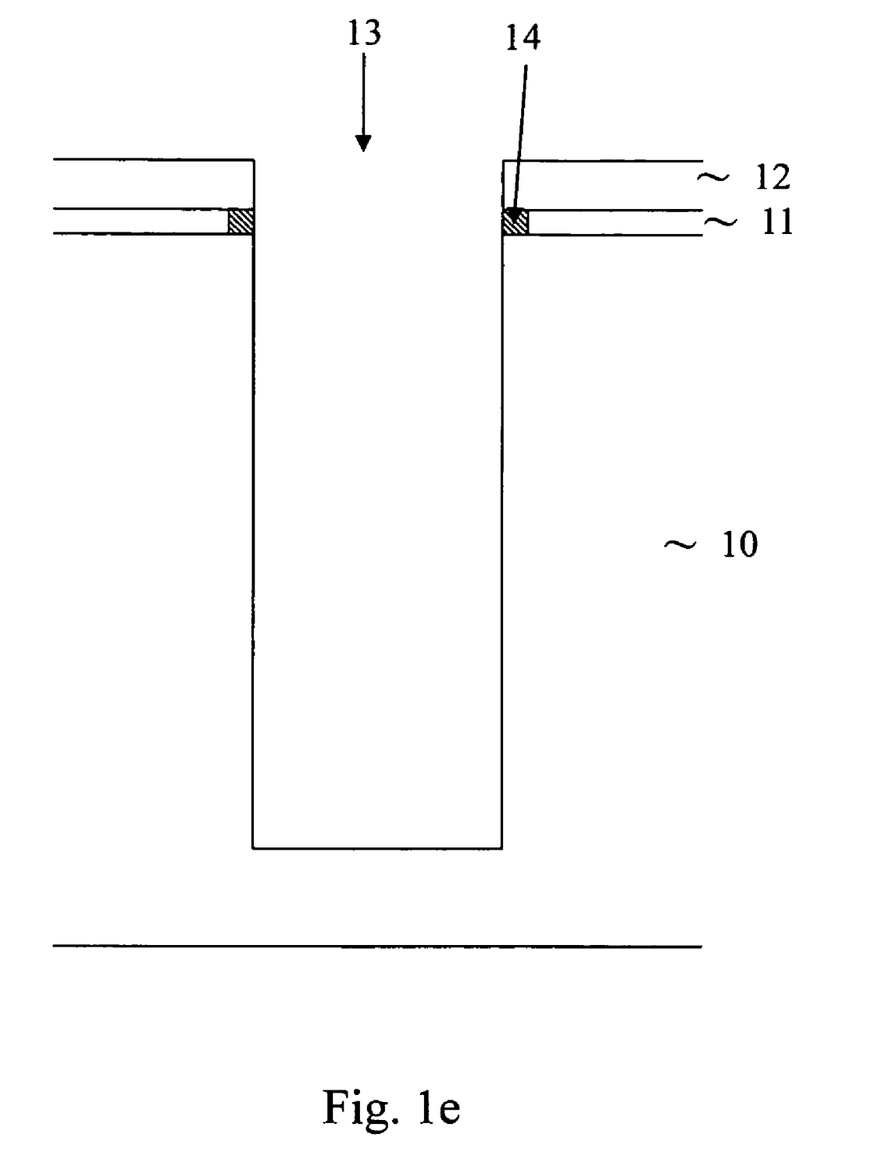

The groove 110, formed due to the undercut phenomenon is refilled with, a dielectric layer, such as a nitride layer 14, as shown in FIG. 1d. Then, unnecessary portion of the nitride layer is removed, only the portion of the nitride layer filled into the groove 110 is retained, as shown in FIG. 1e.

Figure 1F:
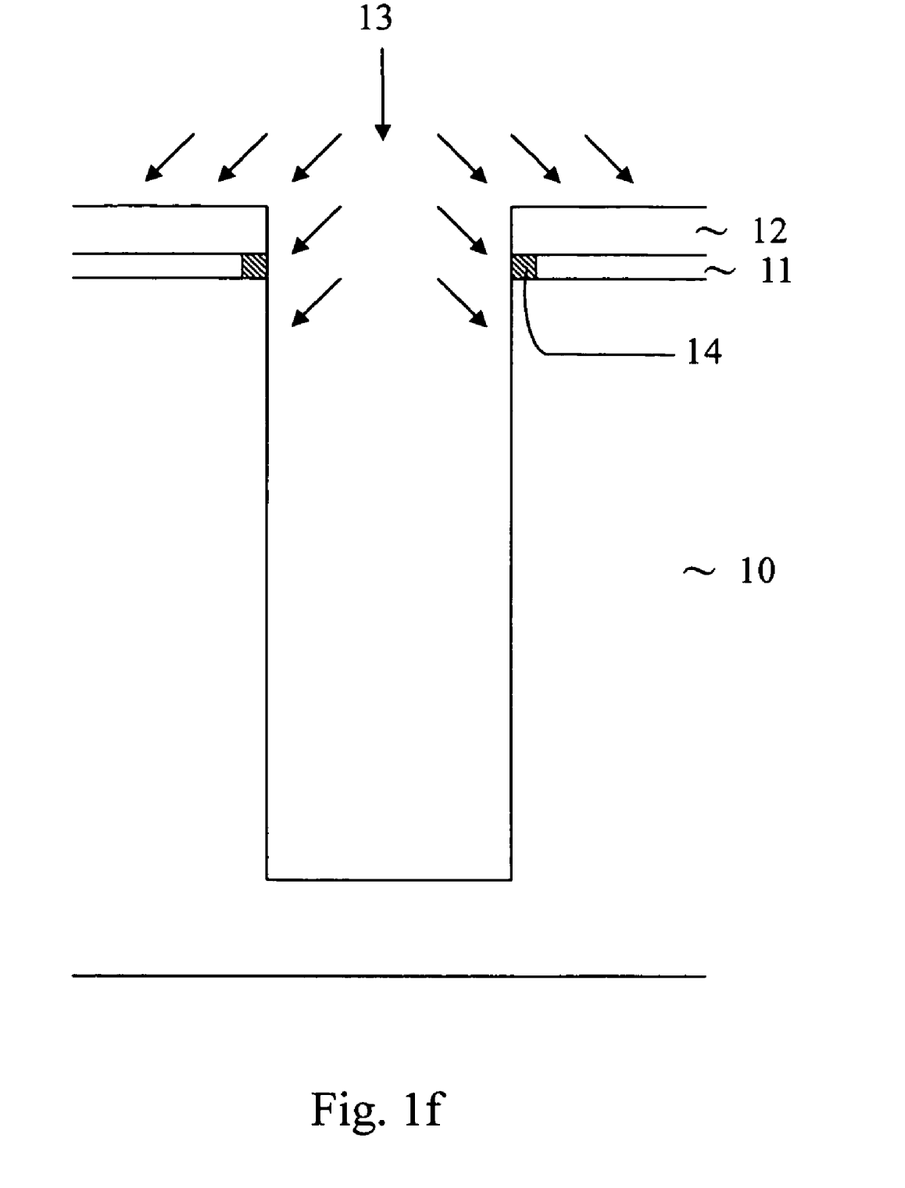

Subsequently, as shown in FIG. 1f, ions are implanted into an upper portion of the side wall of the trench 13 by tilt ion implantation. Alternatively, proper ions are implanted into the upper portion of the sidewall of the trench 13 by any other proper implantation method. In this embodiment, the ions are preferably $N_2^+$ ions. However, any material particles which can reduce the oxdiability of the sidewall of the trench 13 in the subsequent oxidizing step are applicable.

Figure 1G:
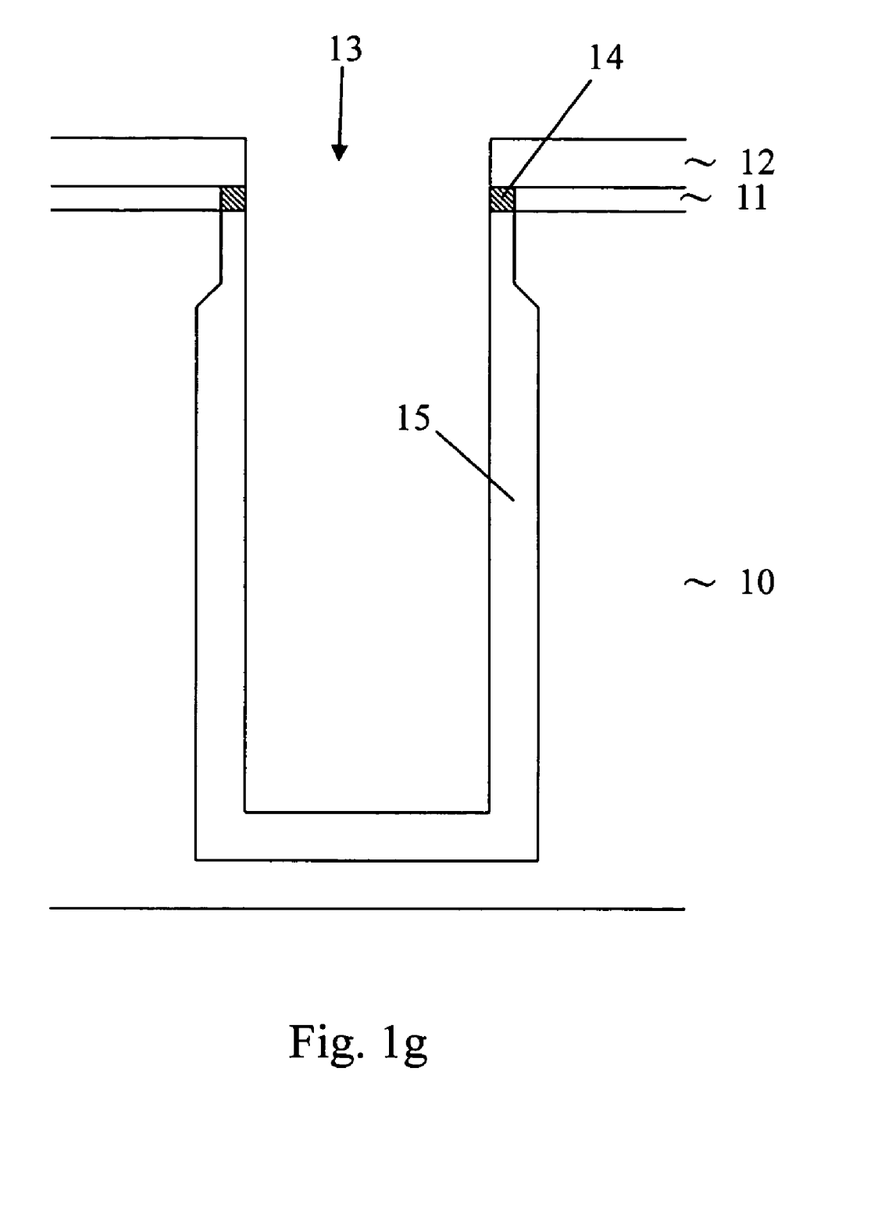

After ion implantation, the sidewall of the trench 13 is oxidized to form an oxide layer 15 ($SiO_2$) by thermal oxidization or any other proper method. Since the upper portion of the sidewall is implanted with $N_2^+$ ions, the rate of oxidization is lower that in than other portions, and accordingly the portion of the oxide layer formed at the portion of sidewall implanted with $N_2^+$ ions is thinner than that formed at the portion of the sidewall not implanted with $N_2^+$ ions, as shown in FIG. 1g.

Figure 1H:
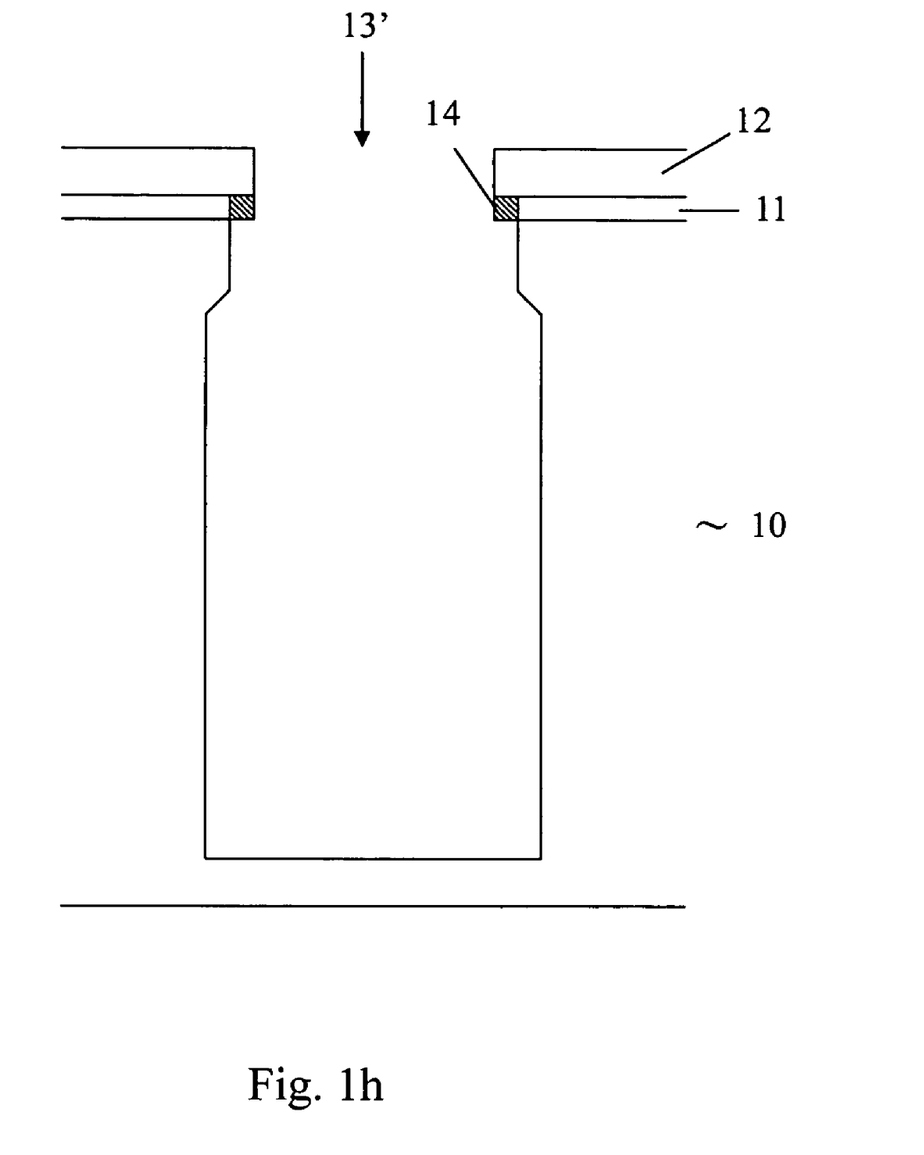

Finally, the oxide layer 15 is stripped, and a bottle shaped trench 13' is accordingly formed as shown in FIG. 1h. Therefore, when a trench capacitor is formed with the bottle shaped trench, the trench capacitor may have large capacitance.

While the embodiments of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A method for forming a bottle shaped trench, said method comprising steps of:
    providing a substrate;
    forming a plurality of operation layers on said substrate;
    forming a photoresist layer on said operation layers to define a predetermined position;
    forming a trench at said predetermined position, said trench having a sidewall;
    implanting predetermined material particles into an upper portion of said sidewall of said trench, said material particles reducing said oxidability of said sidewall of the trench;
    oxidizing said sidewall of said trench to form an oxide layer, said oxide layer formed at said upper portion of said sidewall implanted with said material particles being thinner than said oxide layer formed at the other portion of said sidewall not implanted with said material particles; and removing said oxide layer to form a bottle shaped trench.

2. The method as claimed in claim 1, wherein the material particles are implanted by tilt implantation.

3. The method as claimed in claim 1, wherein the material particle are nitrogen ions.

* * * * *